(12) United States Patent
Lin et al.

(10) Patent No.: US 12,550,463 B2
(45) Date of Patent: Feb. 10, 2026

(54) SENSOR PACKAGE STRUCTURE AND SENSING MODULE THEREOF

(71) Applicant: TONG HSING ELECTRONIC INDUSTRIES, LTD., Taipei (TW)

(72) Inventors: Chien-Hung Lin, Taipei (TW); Jyun-Huei Jiang, Taipei (TW); Wen-Fu Yu, Taipei (TW); Wei-Li Wang, Taipei (TW); Bae-Yinn Hwang, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 396 days.

(21) Appl. No.: 18/374,704

(22) Filed: Sep. 29, 2023

(65) Prior Publication Data
US 2025/0040275 A1 Jan. 30, 2025

(30) Foreign Application Priority Data

Jul. 25, 2023 (TW) .................................. 112127656

(51) Int. Cl.
*H10F 39/00* (2025.01)
*H01L 23/00* (2006.01)
*H01L 23/58* (2006.01)

(52) U.S. Cl.
CPC ......... *H10F 39/804* (2025.01); *H01L 23/562* (2013.01); *H01L 23/585* (2013.01); *H10F 39/811* (2025.01)

(58) Field of Classification Search
CPC .... H10F 39/804; H10F 39/811; H01L 23/562; H01L 23/585
See application file for complete search history.

(56) References Cited

U.S. PATENT DOCUMENTS

| | | | | |
|---|---|---|---|---|
| 2005/0161805 | A1* | 7/2005 | Ono | H10F 39/804 257/E31.128 |
| 2006/0220260 | A1* | 10/2006 | Takahashi | B81C 1/0023 257/778 |
| 2007/0064317 | A1* | 3/2007 | Chen | H04N 23/54 359/811 |
| 2008/0291316 | A1* | 11/2008 | Cheng | H10F 39/804 348/340 |
| 2017/0365632 | A1* | 12/2017 | Tu | H01L 23/3128 |

(Continued)

*Primary Examiner* — Mohsen Ahmadi
(74) *Attorney, Agent, or Firm* — Li & Cai Intellectual Property (USA) Office

(57) ABSTRACT

A sensor package structure includes a substrate, a sensor chip disposed on and electrically coupled to the substrate, a ring-shaped supporting layer disposed on the sensor chip, and a light-permeable layer disposed on the ring-shaped supporting layer. The ring-shaped supporting layer has an inner surrounding surface and an outer surrounding surface that is opposite to the inner surrounding surface. At least one of the inner surrounding surface and the outer surrounding surface has a plurality of round-ended microstructures that are sequentially connected to each other and that surround a sensing region of the sensor chip. An end of each of the round-ended microstructures is a round-ended portion having a radius of less than 1 μm. The light-permeable layer, the inner surrounding surface of the ring-shaped supporting layer, and the sensor chip jointly define an enclosed space.

20 Claims, 15 Drawing Sheets

(56) References Cited

U.S. PATENT DOCUMENTS

| | | | |
|---|---|---|---|
| 2019/0019834 A1* | 1/2019 | Tu | H01L 24/49 |
| 2021/0057470 A1* | 2/2021 | Hung | H10F 39/804 |
| 2021/0398934 A1* | 12/2021 | Hsin | H01L 23/49833 |
| 2022/0254752 A1* | 8/2022 | Lee | H01L 24/85 |
| 2022/0359593 A1* | 11/2022 | Hsu | H01L 23/3128 |

* cited by examiner

SENSOR PACKAGE STRUCTURE AND SENSING MODULE THEREOF

CROSS-REFERENCE TO RELATED PATENT APPLICATION

This application claims the benefit of priority to Taiwan Patent Application No. 112127656, filed on Jul. 25, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure and a sensing module thereof.

BACKGROUND OF THE DISCLOSURE

A conventional sensor package structure includes a glass board, a sensor chip, and an adhesive layer that is sandwiched between the glass board and the sensor chip. In order to reduce possibility of a flare phenomenon generated in the sensor chip, the adhesive layer of the conventional sensor package structure is provided with sharp microstructures to disperse light. However, stress concentration can easily occur in the adhesive layer at distal ends of the sharp microstructures, thereby affecting the structural strength of the conventional sensor package structure.

SUMMARY OF THE DISCLOSURE

In response to the above-referenced technical inadequacies, the present disclosure provides a sensor package structure and a sensing module thereof for effectively improving on the issues associated with conventional sensor package structures.

In order to solve the above-mentioned problems, one of the technical aspects adopted by the present disclosure is to provide a sensor package structure, which includes a substrate, a sensor chip disposed on and electrically coupled to the substrate, a ring-shaped supporting layer disposed on the sensor chip, and a light-permeable layer disposed on the ring-shaped supporting layer. A top surface of the sensor chip includes a sensing region and a carrying region that surrounds the sensing region. The ring-shaped supporting layer is disposed on the carrying region of the sensor chip and surrounds the sensing region. The ring-shaped supporting layer includes a plurality of strips in a ring-shaped arrangement. Each of the strips has a side length, and each of the strips includes an adjustment segment and two layout segments that are respectively connected to two opposite ends of the adjustment segment. The ring-shaped supporting layer includes an inner surrounding surface facing toward the sensing region and an outer surrounding surface that is arranged away from the sensing region. At least one of the inner surrounding surface and the outer surrounding surface has a plurality of zigzagged microstructures sequentially connected to surround the sensing region. The zigzagged microstructures include a plurality of round-ended microstructures arranged on the two layout segments of at least one of the strips. A free end of each of the round-ended microstructures is a round-ended portion having a radius of less than 1 μm. The light-permeable layer, the inner surrounding surface of the ring-shaped supporting layer, and the top surface of the sensor chip jointly define an enclosed space.

In order to solve the above-mentioned problems, another one of the technical aspects adopted by the present disclosure is to provide a sensing module of a sensor package structure, which includes a sensor chip disposed on and electrically coupled to the substrate, a ring-shaped supporting layer disposed on the sensor chip, and a light-permeable layer disposed on the ring-shaped supporting layer. The sensor chip has a top surface including a sensing region and a carrying region that surrounds the sensing region. The ring-shaped supporting layer is disposed on the carrying region of the sensor chip and surrounds the sensing region. The ring-shaped supporting layer includes a plurality of strips in a ring-shaped arrangement. Any two of the strips connected to each other jointly define one of corners. The ring-shaped supporting layer includes an inner surrounding surface facing toward the sensing region and an outer surrounding surface that is arranged away from the sensing region. At least one of the inner surrounding surface and the outer surrounding surface has a plurality of zigzagged microstructures. The zigzagged microstructures include a plurality of round-ended microstructures having a free end that is a round-ended portion having a radius of less than 1 μm. Each of the corners is provided with one of the round-ended microstructures arranged thereon. The light-permeable layer, the inner surrounding surface of the ring-shaped supporting layer, and the top surface of the sensor chip jointly define an enclosed space.

In order to solve the above-mentioned problems, yet another one of the technical aspects adopted by the present disclosure is to provide a sensing module of a sensor package structure, which includes a sensor chip disposed on and electrically coupled to the substrate, a ring-shaped supporting layer disposed on the sensor chip, and a light-permeable layer disposed on the ring-shaped supporting layer. The sensor chip has a top surface including a sensing region and a carrying region that surrounds the sensing region. The ring-shaped supporting layer is disposed on the carrying region of the sensor chip and surrounds the sensing region. The ring-shaped supporting layer includes an inner surrounding surface facing toward the sensing region and an outer surrounding surface that is arranged away from the sensing region. At least one of the inner surrounding surface and the outer surrounding surface has a plurality of round-ended microstructures sequentially connected to surround the sensing region. A free end of the round-ended microstructures is a round-ended portion having a radius of less than 1 μm. The light-permeable layer, the inner surrounding surface of the ring-shaped supporting layer, and the top surface of the sensor chip jointly define an enclosed space.

Therefore, any one of the sensor package structure and the sensing module in the present disclosure is provided with the round-ended microstructures each having the round-ended portion of a specific condition (e.g., the radius being less than 1 μm), thereby preventing the stress concentration issue from being generated in the ring-shaped supporting layer. Moreover, light traveling on the round-ended microstructures of the ring-shaped supporting layer by passing through the light-permeable layer can be scattered in the enclosed space through the round-ended portions, thereby effectively reducing the flare phenomenon of the sensor package structure.

Specifically, in any one of the sensor package structure and the sensing module provide by the present disclosure, the round-ended microstructures are arranged on specific positions (e.g., the layout segments of any one of the strips or the corners), and each of the round-ended microstructures has the round-ended portion of a specific condition (e.g., the radius being less than 1 μm), thereby preventing the stress concentration issue from being generated in the ring-shaped supporting layer and effectively reducing the flare phenomenon of the sensor package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
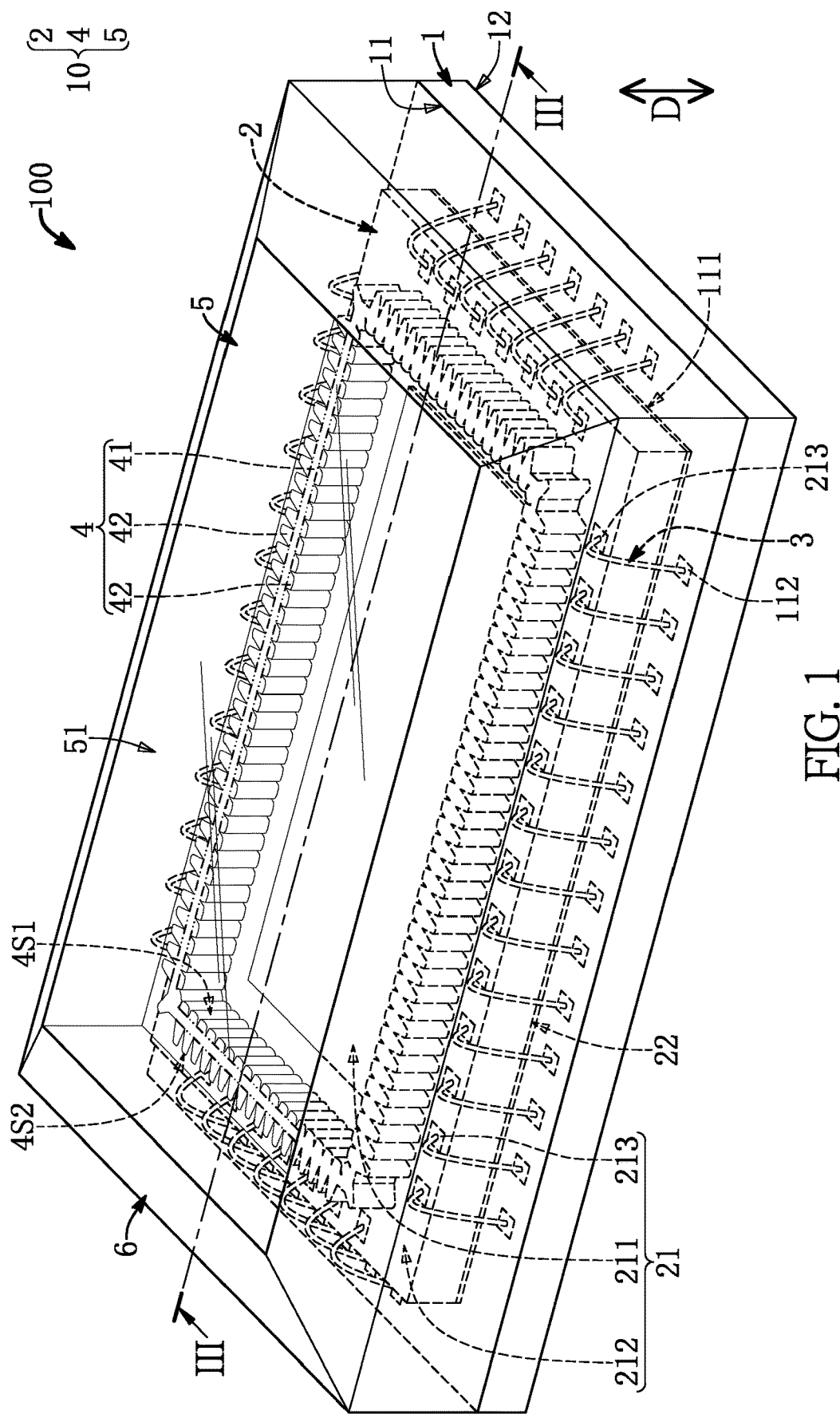
FIG. 1 is a schematic perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
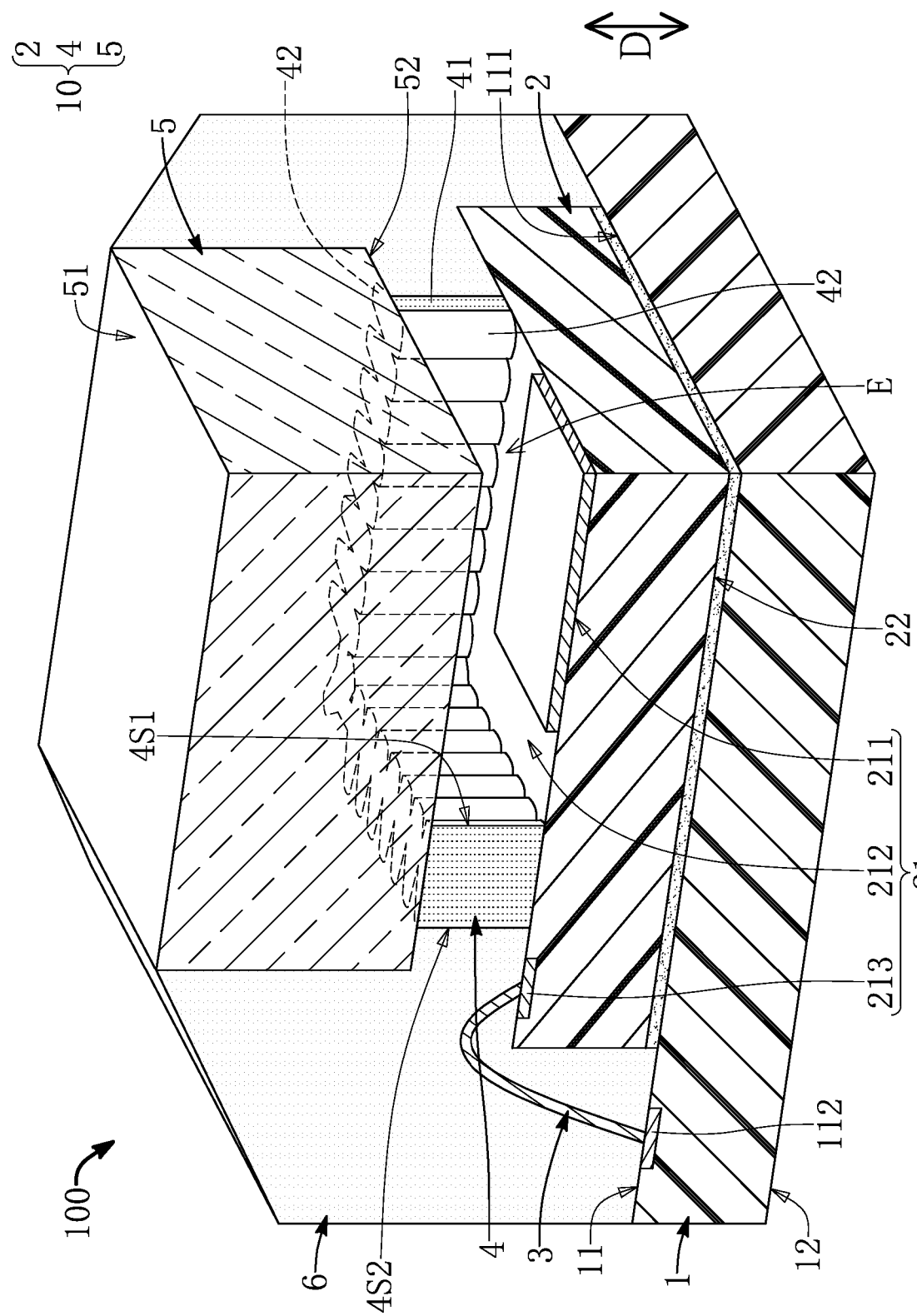
FIG. 2 is a schematic cross-sectional view showing a part of the sensor package structure of FIG. 1.
Figure 3:
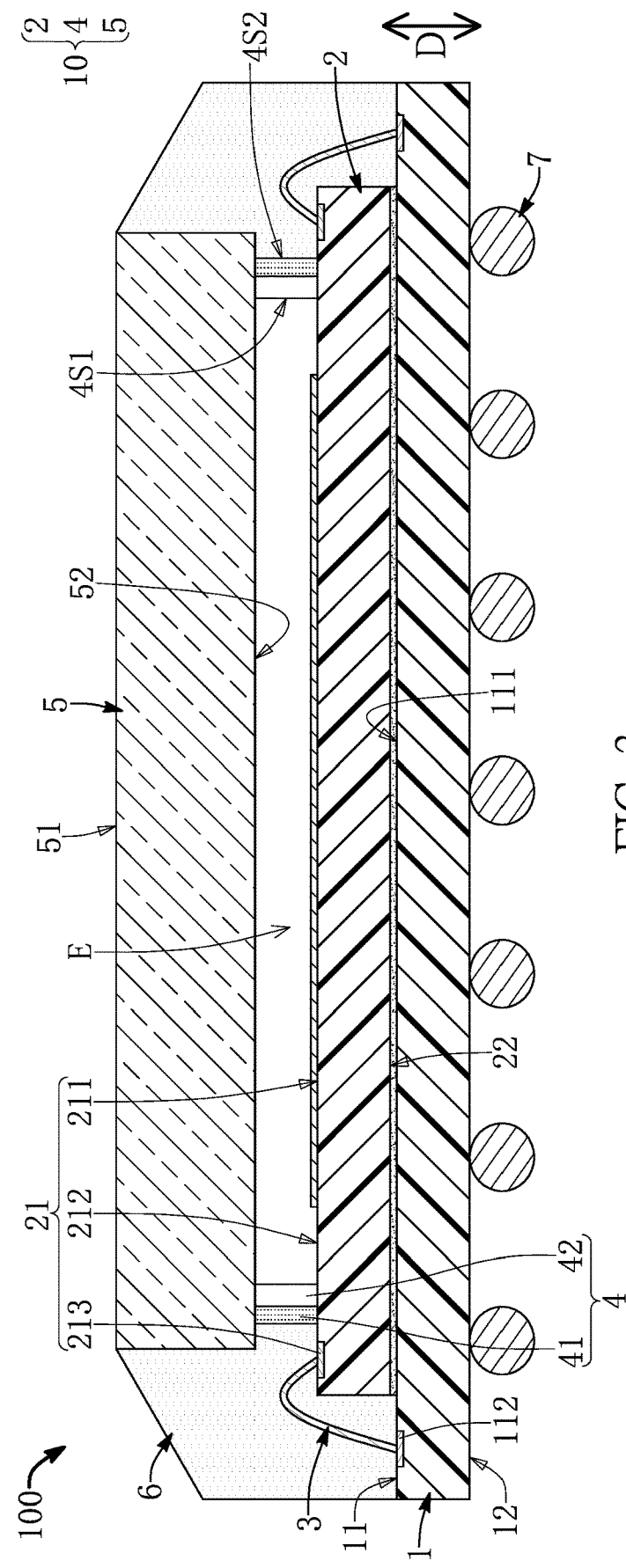
FIG. 3 is a schematic cross-sectional view taken along line III-III of FIG. 1.

Referring to FIG. 1 to FIG. 7, a first embodiment of the present disclosure is provided. As shown in FIG. 1 and FIG. 2, the present embodiment provides a sensor package structure 100. In other words, any package structure not encapsulating a sensor chip therein has a structural design different from that of the sensor package structure 100 of the present embodiment.

As shown in FIG. 1 to FIG. 4A, the sensor package structure 100 includes a substrate 1, a sensor chip 2 disposed on the substrate 1, a plurality of metal wires 3 electrically coupled to the sensor chip 2 and the substrate 1, a ring-shaped supporting layer 4 disposed on the sensor chip 2, a light-permeable layer 5 disposed on the ring-shaped supporting layer 4, and an encapsulant 6 that is formed on the substrate 1. It should be noted the ring-shaped supporting layer 4 in the present embodiment is sandwiched between the sensor chip 2 and the light-permeable layer 5 such as to be jointly defined as a sensing module 10.

The sensor package structure 100 in the present embodiment includes the above components, but can be adjusted or changed according to design requirements. For example, in other embodiments of the present disclosure not shown in the drawings, the sensor package structure 100 can be provided without the encapsulant 6 and the metal wires 3, and the sensor chip 2 is fixed onto and electrically coupled to the substrate 1 in a flip-chip manner or an adhering manner; or, the sensing module 10 can be independently used (e.g., sold) or can be used in cooperation with other components. The structure and connection relationship of each component of the sensor package structure 100 will be recited in the following description.

The substrate 1 of the present embodiment has a square shape or a rectangular shape, but the present disclosure is not limited thereto. An upper surface 11 of the substrate 1 includes a chip-bonding region 111 arranged approximately on a center portion thereof, and the substrate 1 includes a plurality of bonding pads 112 that are disposed on the upper surface 11 and are arranged outside of the chip-bonding region 111. The bonding pads 112 in the present embodiment are in a ring-shaped arrangement, but the present disclosure is not limited thereto. For example, in other embodiments of the present disclosure not shown in the drawings, the bonding pads 112 can be arranged in two rows respectively at two opposite sides of the chip-bonding region 111.

In addition, the substrate 1 can be further provided with a plurality of soldering balls 7 disposed on a lower surface 12 thereof. The substrate 1 can be soldered onto an electronic component (not shown in the drawings) through the soldering balls 7, thereby electrically connecting the sensor package structure 100 to the electronic component.

The sensor chip 2 in the present embodiment has a square shape or a rectangular shape, and is an image sensor chip, but the present disclosure is not limited thereto. A bottom surface 22 of the sensor chip 2 is fixed onto the chip-bonding region 111 of the substrate 1 (through a chip-bonding adhesive along a predetermined direction D). In other words, the sensor chip 2 is arranged to be surrounded on the inside of the bonding pads 112. Moreover, a top surface 21 of the sensor chip 2 has a sensing region 211 and a carrying region 212 that has a ring shape arranged around the sensing region 211. Two ends of each of the metal wires 3 are respectively connected to the substrate 1 and the carrying region 212 of the sensor chip 2, so that the substrate 1 and the sensor chip 2 are electrically coupled to each other.

Specifically, the sensor chip 2 includes a plurality of connection pads 213 arranged on the carrying region 212. In other words, the connection pads 213 are arranged outside of the sensing region 211. The number and positions of the connection pads 213 of the sensor chip 2 in the present embodiment correspond to those of the bonding pads 112 of the substrate 1. In other words, the connection pads 213 in the present embodiment are substantially in a ring-shaped arrangement. Moreover, the two ends of each of the metal wires 3 are respectively connected to one of the bonding pads 112 and the corresponding connection pad 213.

The ring-shaped supporting layer 4 is disposed on the carrying region 212 of the sensor chip 2 and surrounds the sensing region 211. In the present embodiment, the ring-shaped supporting layer 4 is arranged inside of the metal wires 3 and is not in contact with any one of the metal wires 3 (i.e., each of the metal wires 3 is arranged outside of the ring-shaped supporting layer 4 and is entirely embedded in the encapsulant 6), but the present disclosure is not limited thereto. For example, in other embodiments of the present disclosure not shown in the drawings, a part of each of the metal wires 3 can be embedded in the ring-shaped supporting layer 4, and a remaining part of each of the metal wires 3 can be embedded in the encapsulant 6.

The light-permeable layer 5 in the present embodiment is a transparent and flat glass board, but the present disclosure is not limited thereto. The light-permeable layer 5 has an outer surface 51 and an inner surface 52 that is opposite to the outer surface 51. The light-permeable layer 5 is disposed on the ring-shaped supporting layer 4 (through the inner surface 52), so that the light-permeable layer 5, the ring-shaped supporting layer 4 (e.g., an inner surrounding surface 4S1 recited in the following description), and the top surface 21 of the sensor chip 2 jointly define an enclosed space E.

The encapsulant 6 of the present embodiment is opaque for blocking a visible light from passing therethrough. The encapsulant 6 is a liquid encapsulation and is formed on the upper surface 11 of the substrate 1, and edges of the encapsulant 6 are flush with edges of the substrate 1. The sensor chip 2, the ring-shaped supporting layer 4, the light-permeable layer 5, and at least part of each of the metal wires 3 are embedded in the encapsulant 6, and at least part of the outer surface 51 of the light-permeable layer 5 is exposed from the encapsulant 6, but the present disclosure is not limited thereto.

Figure 4:
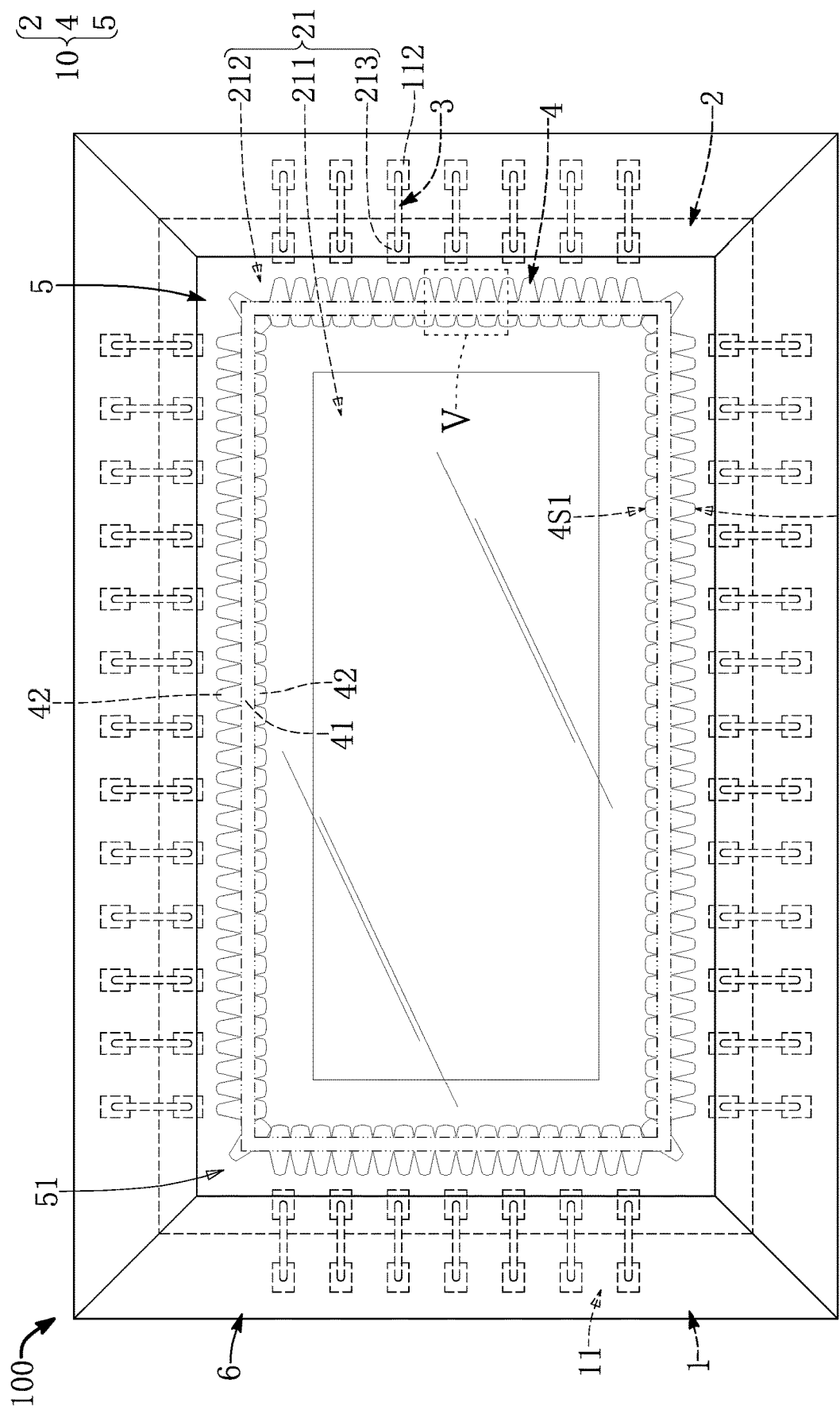
FIG. 4 is a schematic top view of FIG. 1.
Figure 5:
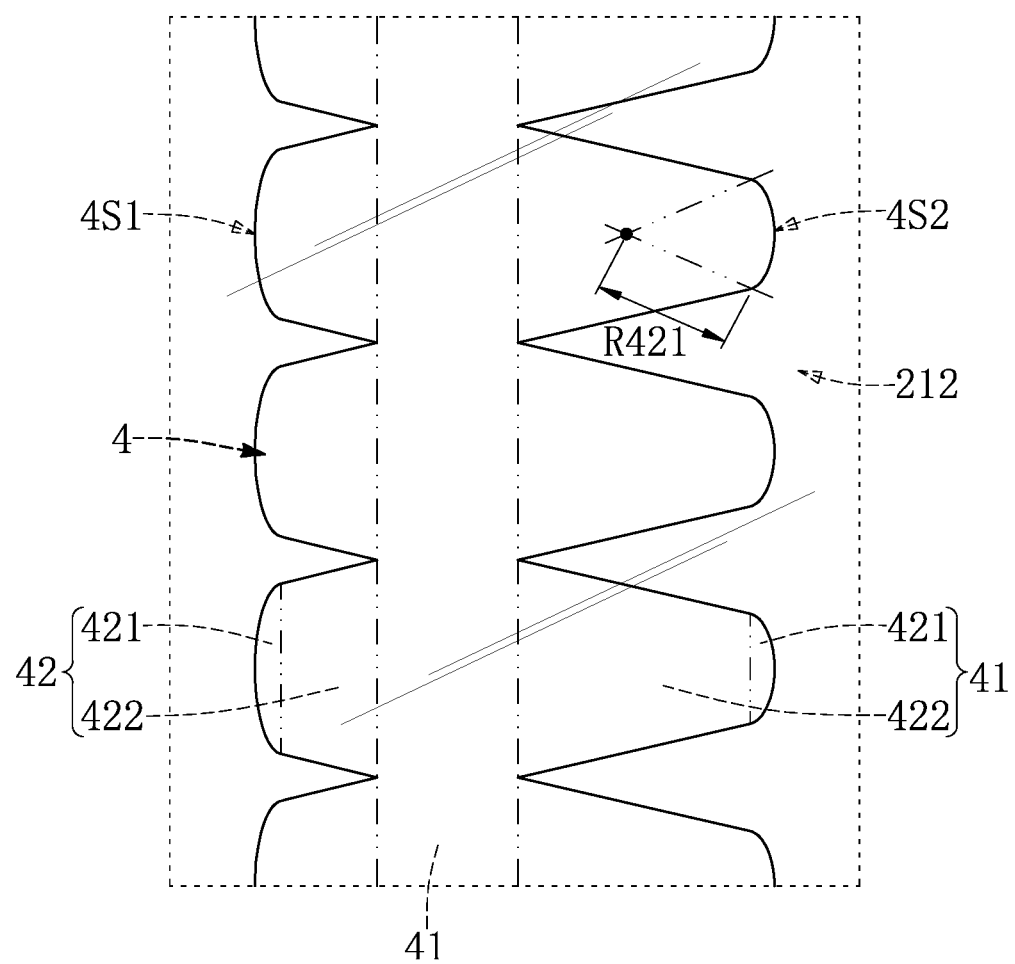
FIG. 5 is a schematic enlarged view of part V of FIG. 4.

Specifically, as shown in FIG. 2, FIG. 4, and FIG. 5, an inner surrounding surface 4S1 and an outer surrounding surface 4S2 of the ring-shaped supporting layer 4 in the present embodiment are respectively arranged on two opposite sides of the ring-shaped supporting layer 4 along directions perpendicular to the predetermined direction D. The inner surrounding surface 4S1 faces toward the sensing region 211, and the outer surrounding surface 4S2 is arranged away from the sensing region 211 (e.g., the outer surrounding surface 4S2 is gaplessly connected to or embedded in the encapsulant 6).

Each of the inner surrounding surface 4S1 and the outer surrounding surface 4S2 provided by the ring-shaped supporting layer 4 has a plurality of round-ended microstructures 42 sequentially connected to surround the sensing region 211. In other words, the round-ended microstructures 42 of each of the inner surrounding surface 4S1 and the outer surrounding surface 4S2 are sequentially connected in one circle that surrounds the sensing region 211.

Specifically, each of the round-ended microstructures 42 in the present embodiment is a pillar-like structure having two opposite ends arranged along the predetermined direction D. The two opposite ends of each of the round-ended microstructures 42 are respectively connected to the top surface 21 of the sensor chip 2 and the inner surface 52 of the light-permeable layer 5. Moreover, a shape of any one of the round-ended microstructures 42 on the inner surrounding surface 4S1 is different from a shape of any one of the round-ended microstructures 42 on the outer surrounding surface 4S2, but the present disclosure is not limited thereto. For example, in other embodiments of the present disclosure not shown in the drawings, the round-ended microstructures 42 can be of substantially the same shape; or, any two of the round-ended microstructures 42 on the inner surrounding surface 4S1 (or the outer surrounding surface 4S2) can be of different shapes.

The ring-shaped supporting layer 4 includes a ring-shaped base 41. The inner surrounding surface 4S1 and the outer surrounding surface 4S2 are respectively located at two opposite sides of the ring-shaped base 41, and the round-ended microstructures 42 are integrally connected to the ring-shaped base 41. Moreover, each of the round-ended microstructures 42 has a round-ended portion 421 arranged on a free end thereof and a light-guiding portion 422 that connects the round-ended portion 421 to the ring-shaped base 41. In each of the round-ended microstructures 42, the round-ended portion 421 has a radius R421 of less than 1 μm, an angle of the round-ended portion 421 is preferably less than or equal to 180 degrees, and the light-guiding portion 422 gradually tapers in a direction from the ring-shaped base 41 toward the round-ended portion 421 and has a truncated cone shape.

Accordingly, the sensor package structure 100 or the sensing module 10 in the present embodiment is provided with the round-ended microstructures 42 each having the round-ended portion 421 of a specific condition (e.g., the radius R421 being less than 1 μm), thereby preventing the stress concentration issue from being generated in the ring-shaped supporting layer 4.

Moreover, light traveling on the round-ended microstructures 42 of the ring-shaped supporting layer 4 by passing through the light-permeable layer 5 can be scattered in the enclosed space E through the round-ended portions 421 and the light-guiding portions 422, thereby effectively reducing the flare phenomenon of the sensor package structure 100.

Figure 6:
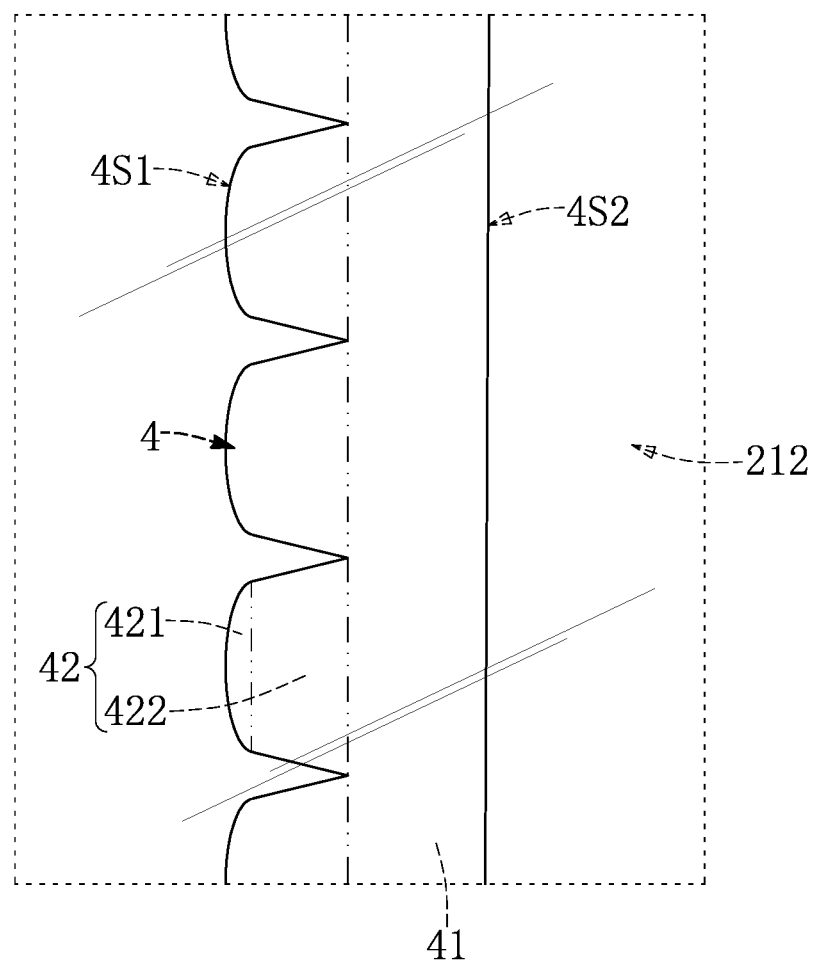
FIG. 6 is a schematic enlarged view showing the part V of FIG. 4 in another configuration.
Figure 7:
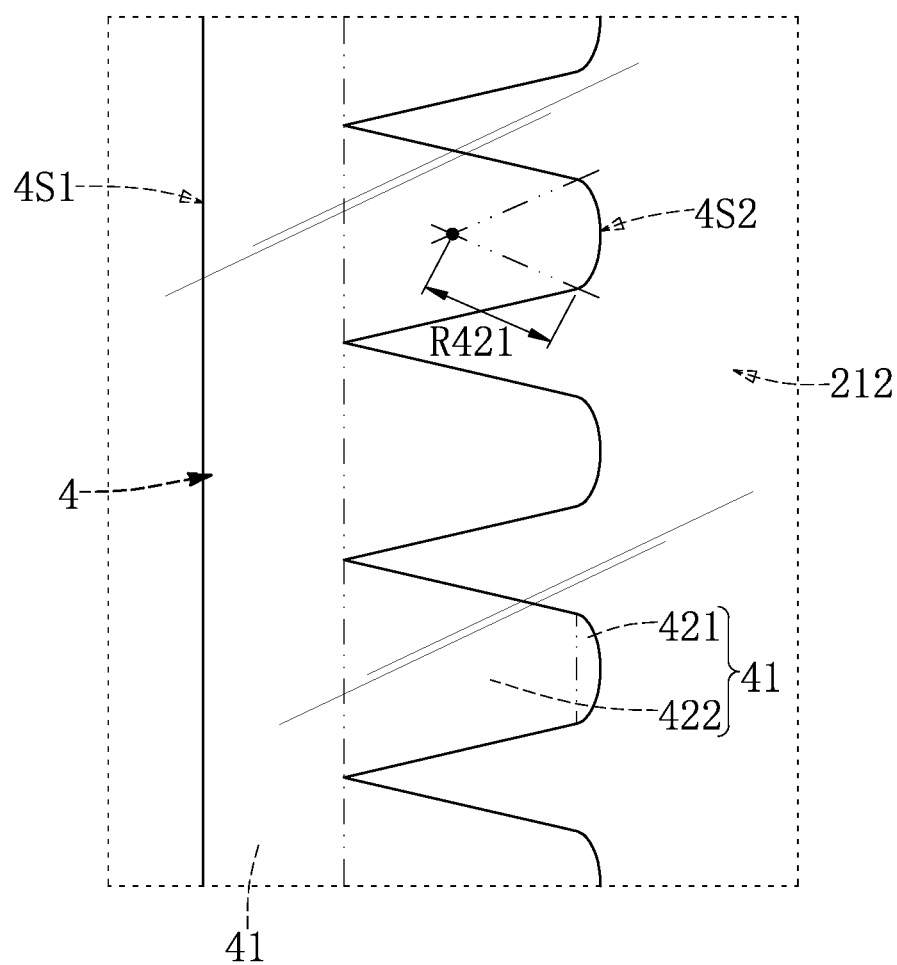
FIG. 7 is a schematic enlarged view showing the part V of FIG. 4 in yet another configuration.

It should be noted that the round-ended microstructures 42 shown in FIG. 5 are arranged on the inner surrounding surface 4S1 and the outer surrounding surface 4S2, but the present disclosure is not limited thereto. For example, as shown in FIG. 6, the round-ended microstructures 42 can be arranged only on the inner surrounding surface 4S1; or, as shown in FIG. 7, the round-ended microstructures 42 can be arranged only on the outer surrounding surface 4S2. In summary, as shown in FIG. 5 to FIG. 7, the round-ended microstructures 42 of the ring-shaped supporting layer 4 can be arranged on at least one of the inner surrounding surface 4S1 and the outer surrounding surface 4S2 according to design requirements.

Second Embodiment

Figure 8:
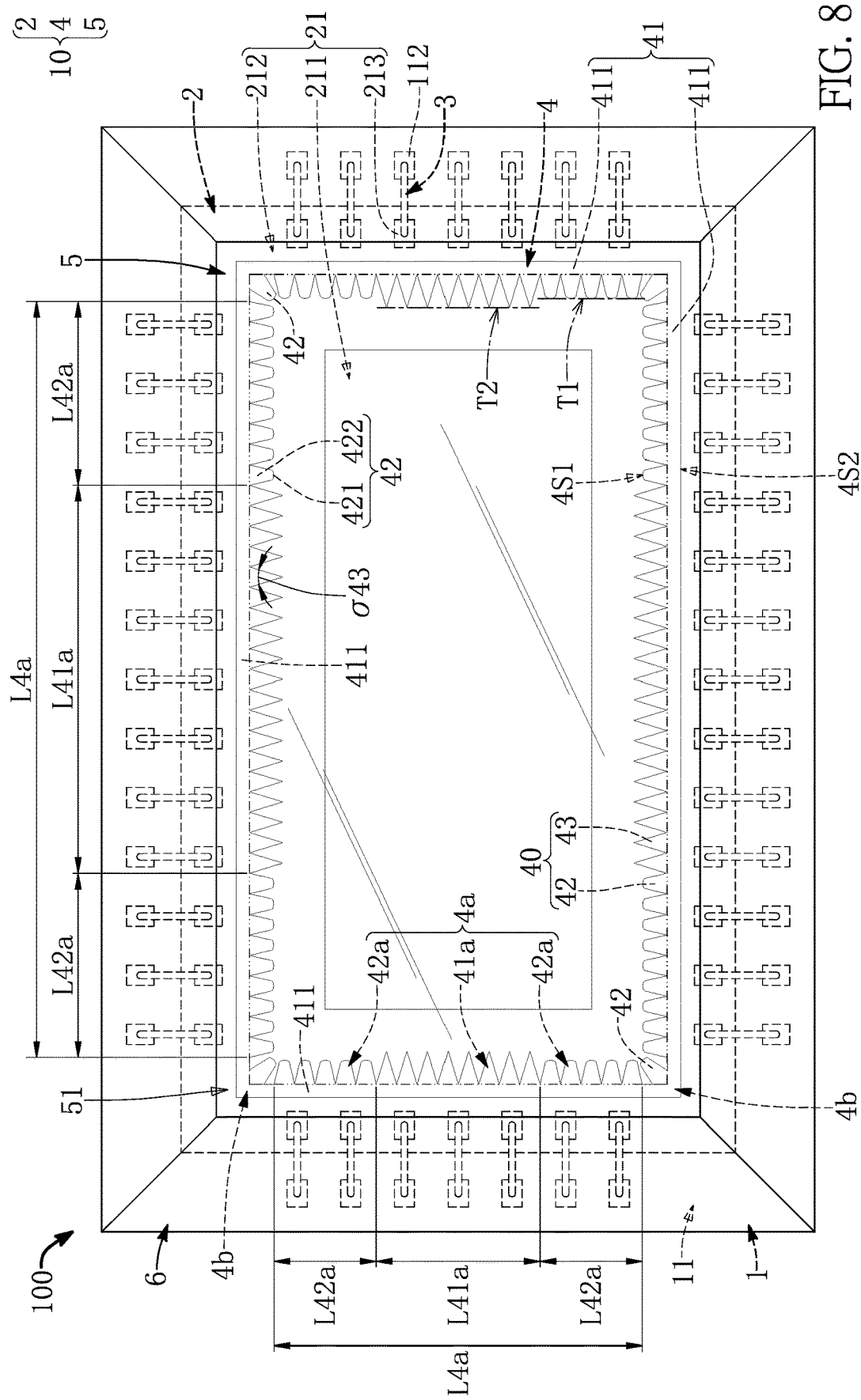
FIG. 8 is a schematic top view of the sensor package structure according to a second embodiment of the present disclosure.
Figure 9:
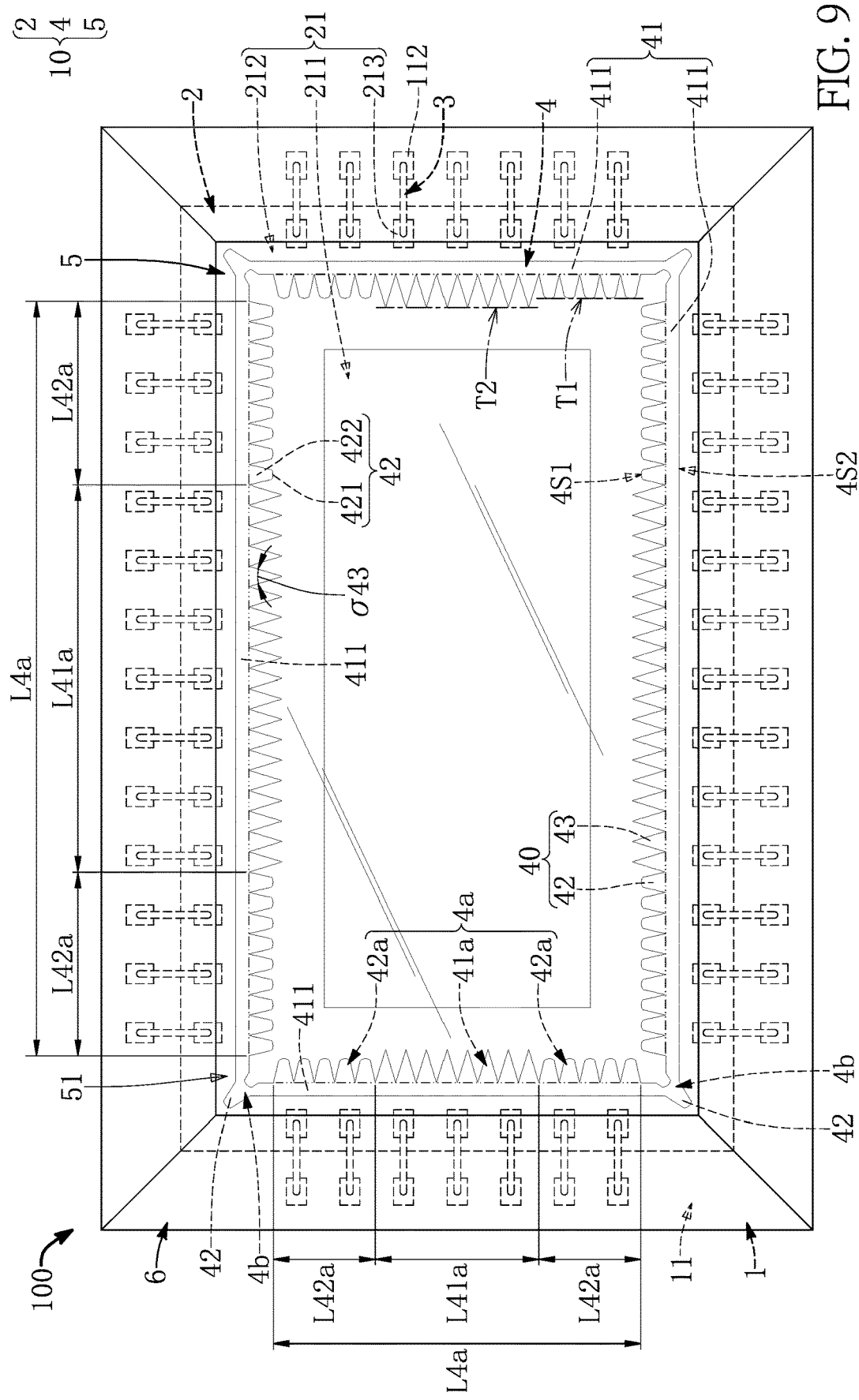
FIG. 9 is a schematic top view of the sensor package structure in another configuration according to the second embodiment of the present disclosure.
Figure 10:
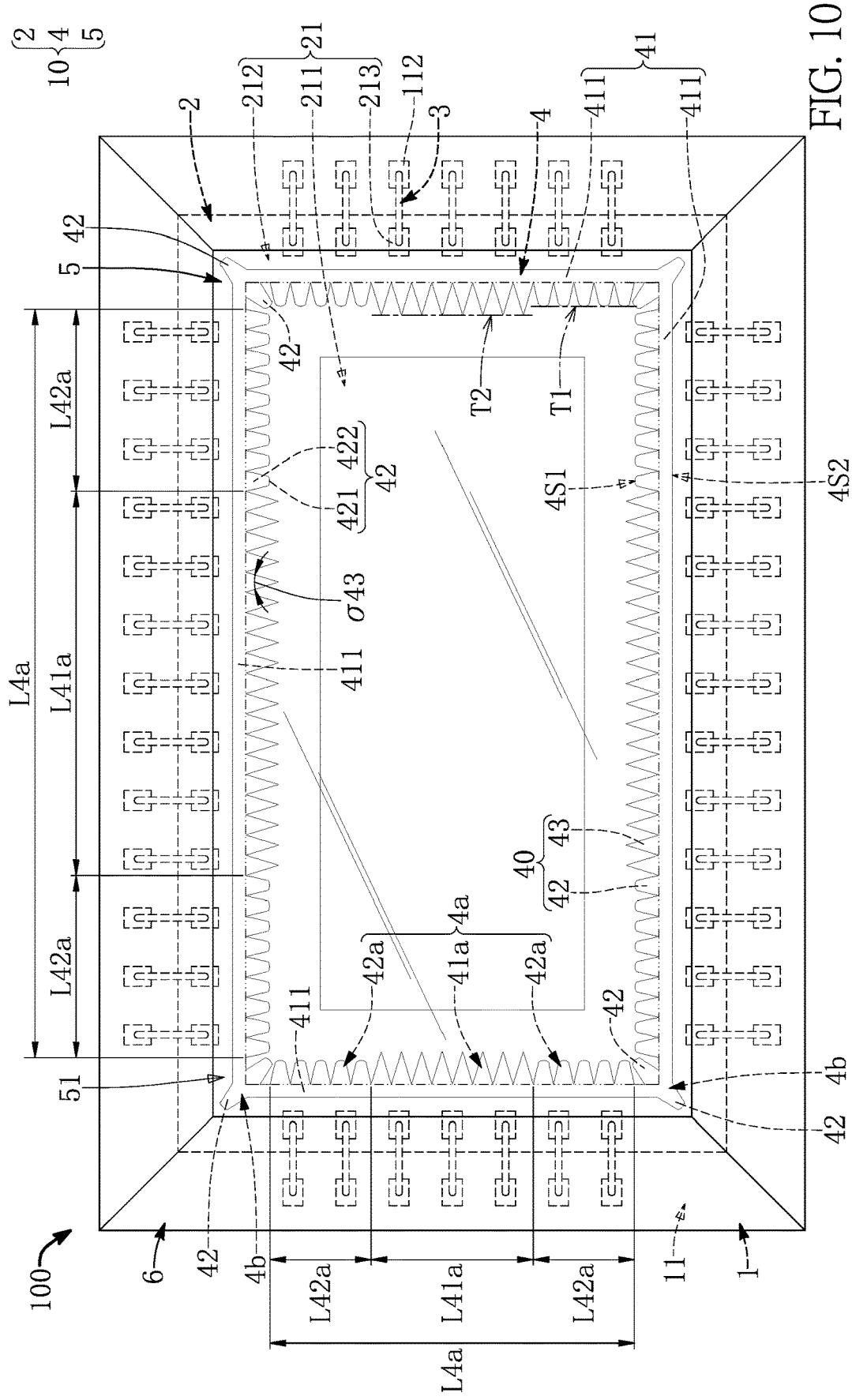
FIG. 10 is a schematic top view of the sensor package structure in yet another configuration according to the second embodiment of the present disclosure.

Referring to FIG. 8 to FIG. 10, a second embodiment of the present disclosure, which is similar to the first embodiment of the present disclosure, is provided. For the sake of brevity, descriptions of the same components in the first and second embodiments of the present disclosure will be omitted herein, and the main difference between the second embodiment and the first embodiment is the ring-shaped supporting layer 4.

In the present embodiment, the ring-shaped supporting layer 4 includes a plurality of strips 4a in a ring-shaped arrangement and a plurality of corners 4b. The ring-shaped arrangement of the strips 4a in the present embodiment is rectangular, each of the strips 4a has a side length L4a, and any two of the strips 4a adjacent to each other are connected through one of the corners 4b. Each of the strips 4a includes an adjustment segment 41a and two layout segments 42a that are respectively connected to two opposite ends of the adjustment segment 41a. In each of the strips 4a, a length L42a of each of the two layout segments 42a can be at least 10% of the side length L4a, and is preferably less than or equal to a length L41a of the adjustment segment 41a, but the present disclosure is not limited thereto.

Specifically, as shown in FIG. 8, the inner surrounding surface 4S1 of the ring-shaped supporting layer 4 has a plurality of zigzagged microstructures 40 sequentially connected in one circle that surrounds the sensing region 211, but the present disclosure is not limited thereto. For example, in other embodiments of the present disclosure not shown in the drawings, the zigzagged microstructures 40 can be arranged in one circle on the outer surrounding surface 4S2; or, the zigzagged microstructures 40 can be in two circles respectively arranged on the inner surrounding surface 4S1 and the outer surrounding surface 4S2.

Moreover, the zigzagged microstructures 40 include a plurality of round-ended microstructures 42 and a plurality of acute end microstructures 43. The round-ended microstructures 42 are arranged on the layout segments 42a of the strips 4a and the corners 4b (e.g., each of the corners 4b is provided with at least one of the round-ended microstructures 42 arranged thereon), and the acute end microstructures 43 are arranged on the adjustment segments 41a of the strips 4a.

In addition, the at least one round-ended microstructure 42 on each of the corners 4b can be arranged on at least one of the inner surrounding surface 4S1 and the outer surrounding surface 4S2. For example, as shown in FIG. 8, each of the corners 4b can be provided with one of the round-ended microstructures 42 arranged on the inner surrounding surface 4S1; or, as shown in FIG. 9, each of the corners 4b can be provided with one of the round-ended microstructures 42 arranged on the outer surrounding surface 4S2; or, as shown in FIG. 10, each of the corners 4b can be provided with two of the round-ended microstructures 42 respectively arranged on the inner surrounding surface 4S1 and the outer surrounding surface 4S2.

As shown in FIG. 8, each of the strips 4 includes an elongated base 411 having two opposite ends respectively connected to two of the corners 4b. In each of the strips 4, each of the round-ended microstructures 42 has a round-ended portion 421 arranged on a free end thereof and a light-guiding portion 422 that connects the round-ended portion 421 to the elongated base 411. The round-ended portion 421 has a radius R421 of less than 1 μm, and the light-guiding portion 422 gradually tapers in a direction from the ring-shaped base 41 toward the round-ended portion 421 and has a truncated cone shape. The specific shape of each of the round-ended microstructures 42 in the present embodiment can be identical to that of the first embodiment, and descriptions of the round-ended microstructure 42 in the present embodiment will be omitted herein for the sake of brevity.

In addition, a free end of each of the acute end microstructures 43 is sharp and has an angle σ43 less than or equal to 40 degrees. It should be noted that, in each of the strips 4a of the present embodiment, end points of the round-ended microstructures 42 jointly define a first tangent line T1, and end points of the acute end microstructures 43 jointly define a second tangent line T2 that is spaced apart from and parallel to the first tangent line T1. In other words, in each of the strips 4a, a distance between the first tangent line T1 and the elongated base 411 is preferably less than a distance between the second tangent line T2 and the elongated base 411, but the present disclosure is not limited thereto.

Accordingly, in the sensor package structure 100 or the sensing module 10 provided by the present embodiment, since each of the corners 4b and the layout segments 42a adjacent thereto easily has the stress concentration issue and the flare phenomenon, the round-ended microstructures 42 are arranged on specific positions (e.g., the layout segments 42a of the strips 4a or the corners 4b), and each of the round-ended microstructures 42 has the round-ended portion 421 of a specific condition (e.g., the radius being less than 1 μm), thereby preventing the stress concentration issue from being generated in the ring-shaped supporting layer 4 and effectively reducing the flare phenomenon of the sensor package structure 100.

Third Embodiment

Referring to FIG. 11 to FIG. 14, a third embodiment of the present disclosure, which is similar to the second embodiment of the present disclosure, is provided. For the sake of brevity, descriptions of the same components in the third and second embodiments of the present disclosure will be omitted herein, and the following description only discloses different features between the third and second embodiments.

Figure 11:
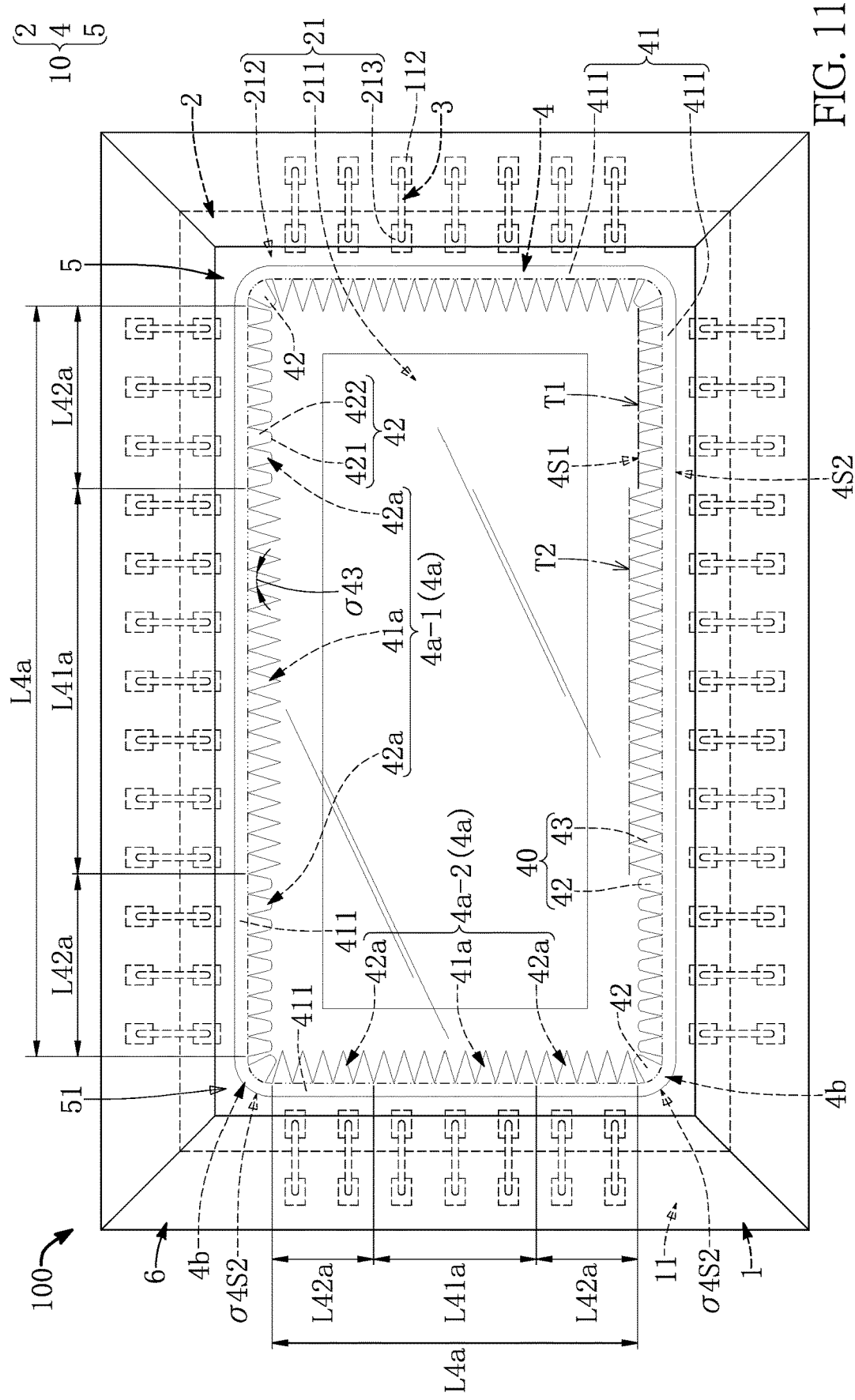
FIG. 11 is a schematic top view of the sensor package structure according to a third embodiment of the present disclosure.

In the present embodiment, the ring-shaped arrangement of the strips 4a is rectangular, the strips 4a include two first strips 4a-1 facing toward each other and two second strips 4a-2 that face toward each other, and a length of each of the two first strips 4a-1 in the present embodiment is greater than a length of any one of the two second strips 4a-2. As shown in FIG. 11, the round-ended microstructures 42 are only arranged on the two layout segments 42a of each of the two first strips 4a-1, and the acute end microstructures 43 are arranged on each of the second strips 4a-2 and the adjustment segment 41a of each of the two first strips 4a-1.

Figure 12:
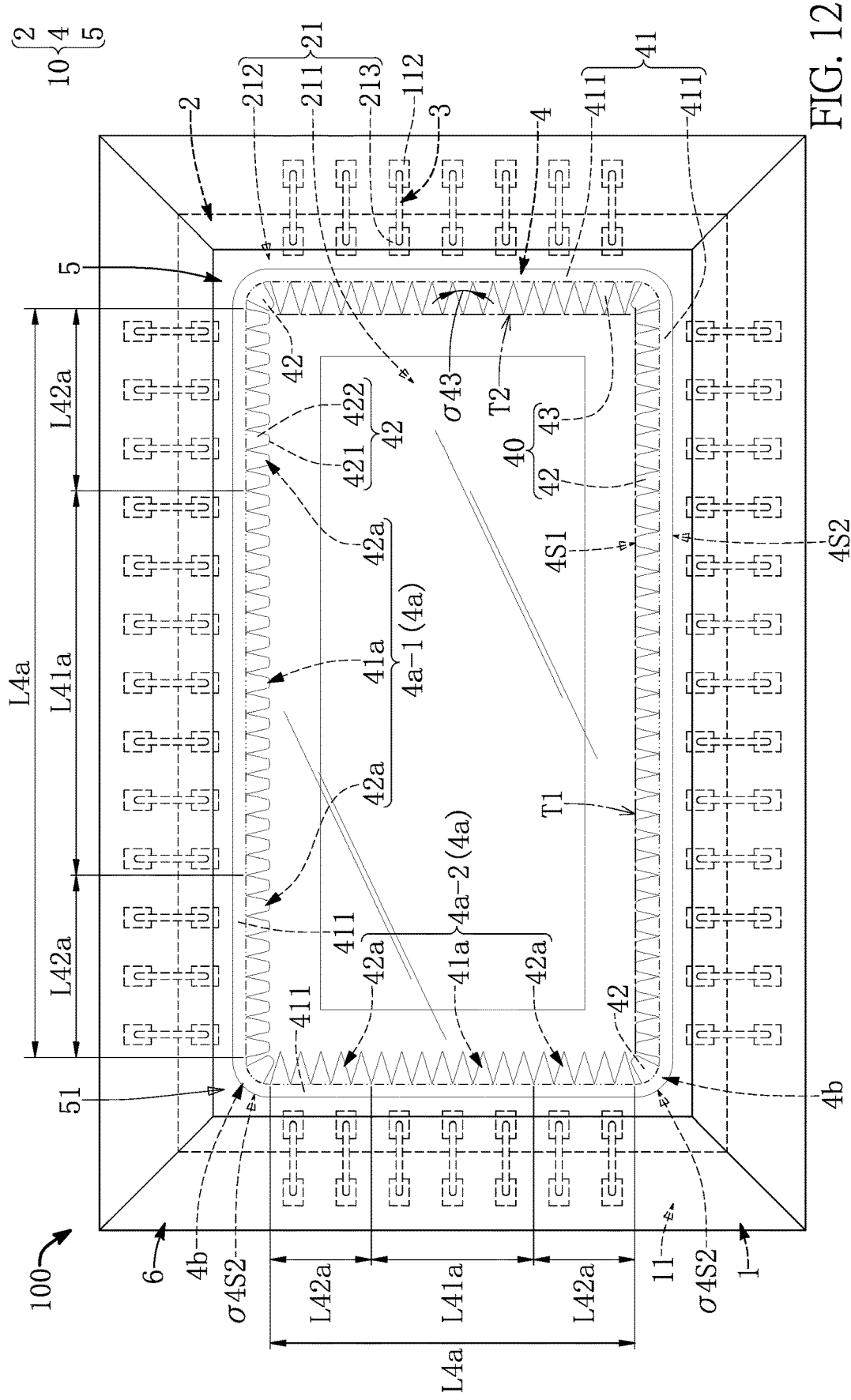
FIG. 12 is a schematic top view of the sensor package structure in another configuration according to the third embodiment of the present disclosure.

Moreover, as shown in FIG. 12, the round-ended microstructures 42 can be arranged only on the adjustment segment 41a and the two layout segments 42a of each of the two first strips 4a-1, and the acute end microstructures 43 are arranged on the adjustment segment 41a and the two layout segments 42a of each of the second strips 4a-2, but the present disclosure is not limited thereto.

Figure 13:
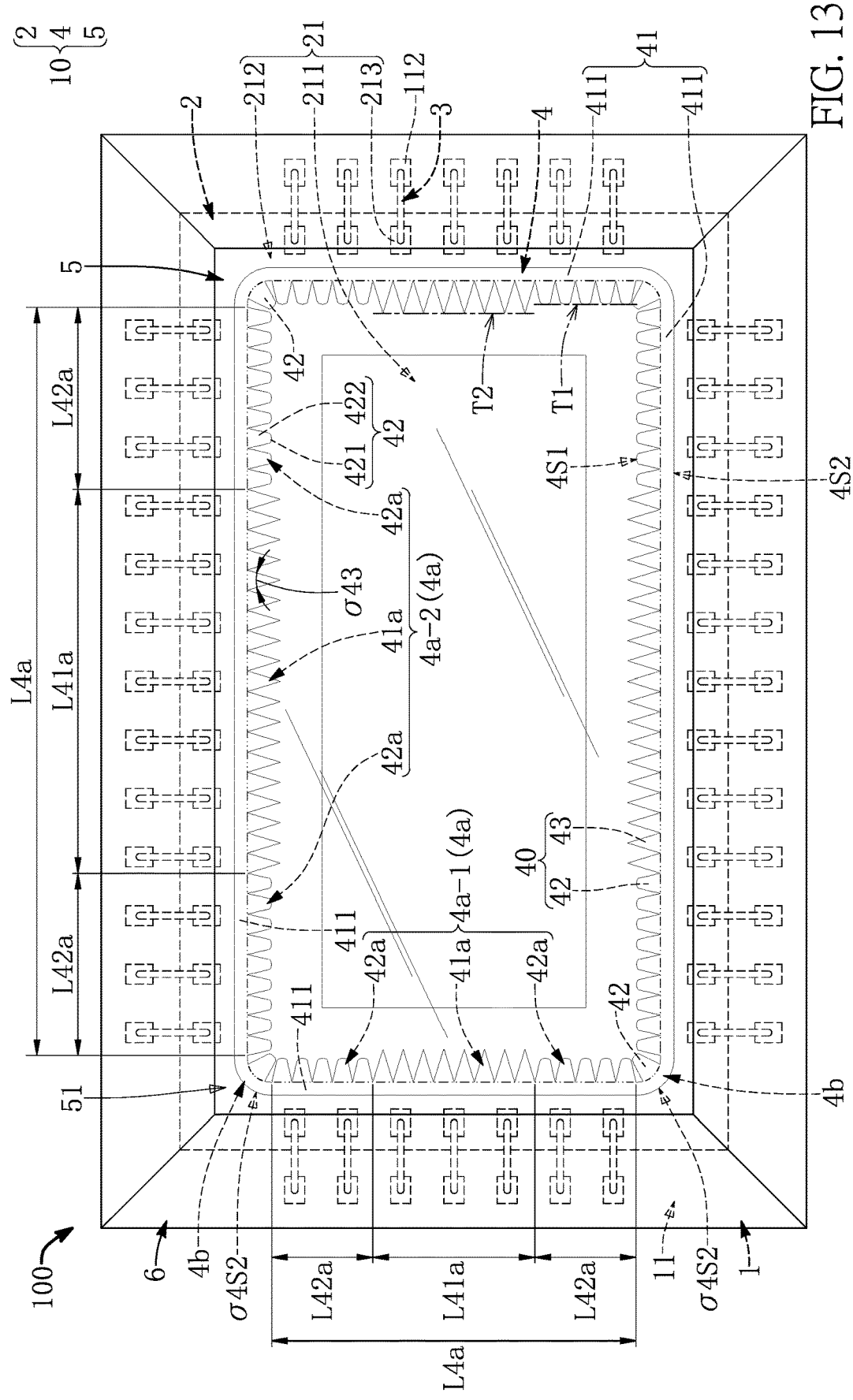
FIG. 13 is a schematic top view of the sensor package structure in yet another configuration according to the third embodiment of the present disclosure.
Figure 14:
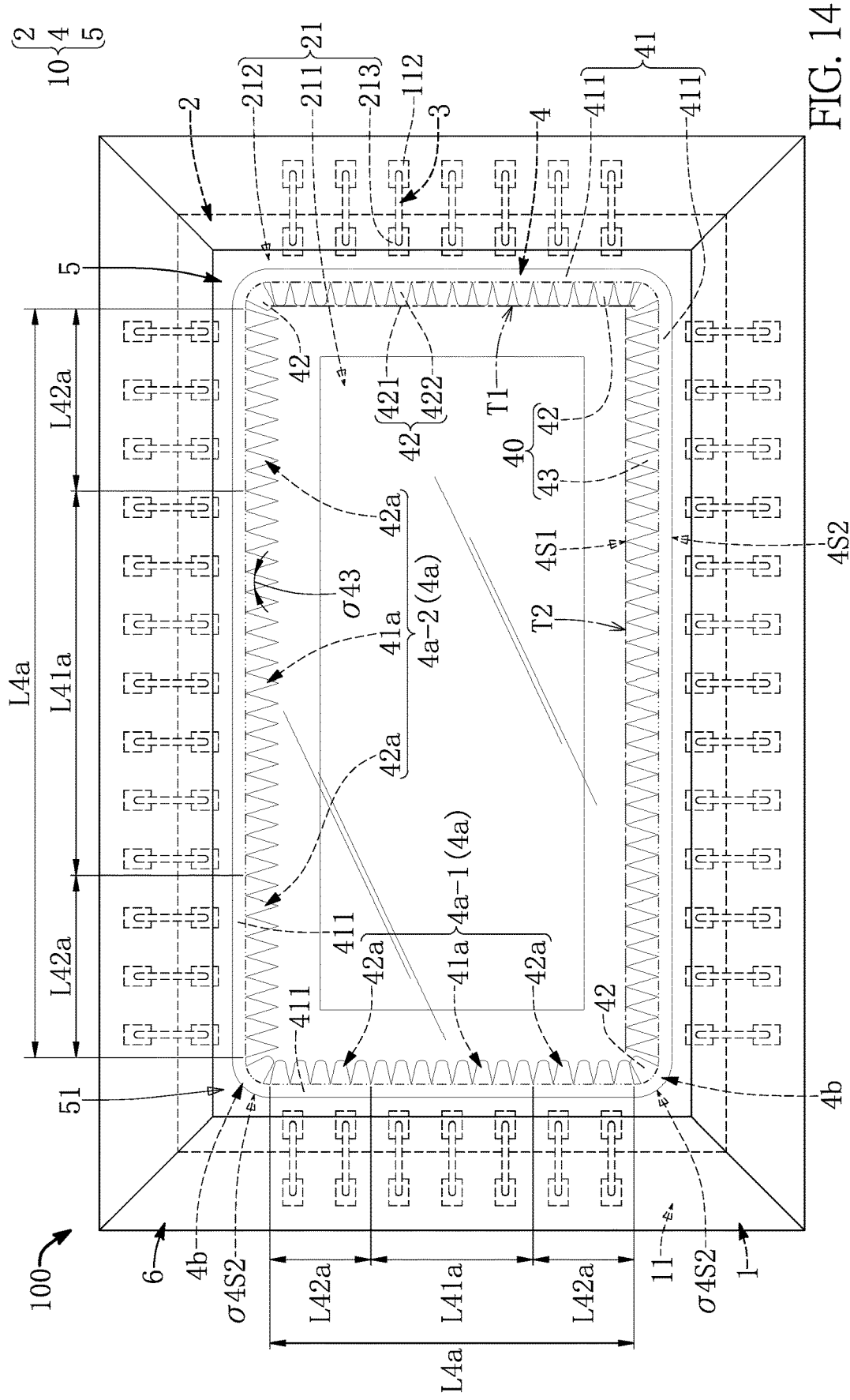
FIG. 14 is a schematic top view of the sensor package structure in still yet another configuration according to the third embodiment of the present disclosure.

For example, as shown in FIG. 13 and FIG. 14, the length of each of the two first strips 4a-1 can be smaller than the length of any one of the two second strips 4a-2. In other embodiments of the present disclosure not shown in the drawings, the round-ended microstructures 42 can be arranged only on the two layout segments 42a of at least one of the strips 4a (e.g., the first strip 4a-1 or second strip 4a-2).

In addition, as shown in FIG. 11, the outer surrounding surface 4S2 can have a plurality of arc angles σ4S2 respectively arranged on the corners 4b. Moreover, in each of the corners 4b, a radius of the arc angle σ4S2 is greater than the radius of the round-ended portion 421 of the round-ended microstructure 42.

Fourth Embodiment

Figure 15:
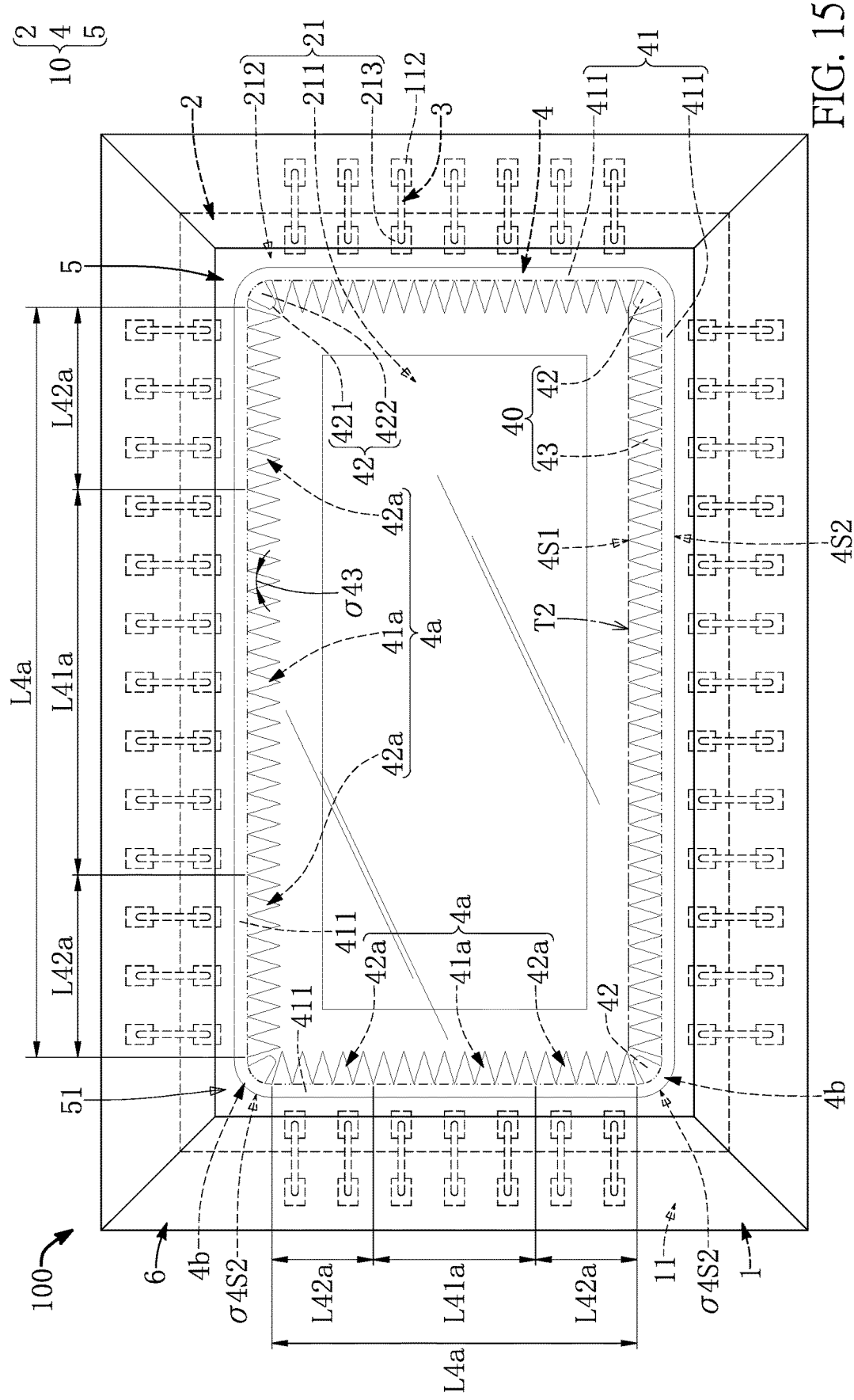
FIG. 15 is a schematic top view of the sensor package structure according to a fourth embodiment of the present disclosure.

Referring to FIG. 15, a fourth embodiment of the present disclosure, which is similar to the first to third embodiments of the present disclosure, is provided. For the sake of brevity, descriptions of the same components in the first to third embodiments of the present disclosure will be omitted herein, and the following description only discloses different features among the first to fourth embodiments.

In the present embodiment, at least one of the inner surrounding surface 4S1 and the outer surrounding surface 4S2 has a plurality of zigzagged microstructures 40. The zigzagged microstructures 40 include a plurality of round-ended microstructures 42 and a plurality of acute end microstructures 4. Each of the corners 4b is provided with one of the round-ended microstructures 42 arranged thereon, and the acute end microstructures 4 are arranged on the strips 4a in multiple rows. It should be noted that the round-ended microstructure 42 on each of the corners 4a in the present embodiment is arranged on the inner surrounding surface 4S1. In other words, the acute end microstructures 43 of each of the strips 4 are arranged in one row located between the round-ended microstructures 42 arranged on two of the corners 4b.

Beneficial Effects of the Embodiments

In conclusion, any one of the sensor package structure and the sensing module in the present disclosure is provided with the round-ended microstructures each having the round-ended portion of a specific condition (e.g., the radius being less than 1 μm), thereby preventing the stress concentration issue from being generated in the ring-shaped supporting layer. Moreover, light traveling on the round-ended microstructures of the ring-shaped supporting layer by passing through the light-permeable layer can be scattered in the enclosed space through the round-ended portions, thereby effectively reducing the flare phenomenon of the sensor package structure.

Specifically, in any one of the sensor package structure and the sensing module provided by the present disclosure, the round-ended microstructures are arranged on specific positions (e.g., the layout segments of any one of the strips or the corners), and each of the round-ended microstructures has the round-ended portion of a specific condition (e.g., the radius being less than 1 μm), thereby preventing the stress concentration issue from being generated in the ring-shaped supporting layer and effectively reducing the flare phenomenon of the sensor package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate;
a sensor chip disposed on and electrically coupled to the substrate, wherein a top surface of the sensor chip includes a sensing region and a carrying region that surrounds the sensing region;
a ring-shaped supporting layer being disposed on the carrying region of the sensor chip and surrounding the sensing region, wherein the ring-shaped supporting layer includes a plurality of strips in a ring-shaped arrangement, wherein each of the strips has a side length, and each of the strips includes an adjustment segment and two layout segments that are respectively connected to two opposite ends of the adjustment segment, and wherein the ring-shaped supporting layer includes:
an inner surrounding surface facing toward the sensing region; and
an outer surrounding surface arranged away from the sensing region, wherein at least one of the inner surrounding surface and the outer surrounding surface has a plurality of zigzagged microstructures sequentially connected to surround the sensing region, wherein the zigzagged microstructures include a plurality of round-ended microstructures arranged on the two layout segments of at least one of the strips, and wherein a free end of each of the round-ended microstructures is a round-ended portion having a radius of less than 1 μm; and
a light-permeable layer disposed on the ring-shaped supporting layer, wherein the light-permeable layer, the inner surrounding surface of the ring-shaped supporting layer, and the top surface of the sensor chip jointly define an enclosed space.

2. The sensor package structure according to claim 1, wherein the round-ended microstructures are arranged on the two layout segments of each of the strips.

3. The sensor package structure according to claim 2, wherein the zigzagged microstructures further include a plurality of acute end microstructures arranged on the adjustment segment of each of the strips, and wherein a free end of each of the acute end microstructures is sharp and has an angle of less than or equal to 40 degrees.

4. The sensor package structure according to claim 3, wherein, in each of the strips, end points of the round-ended microstructures jointly define a first tangent line, and end points of the acute end microstructures jointly define a second tangent line that is spaced apart from and parallel to the first tangent line.

5. The sensor package structure according to claim 1, wherein the ring-shaped arrangement of the strips is rectangular, and the strips includes two first strips facing toward each other and two second strips that face toward each other, and wherein the round-ended microstructures are arranged only on the two layout segments of each of the two first strips.

6. The sensor package structure according to claim 5, wherein the zigzagged microstructures further include a plurality of acute end microstructures arranged on the two second strips and the adjustment segment of each of the two first strips, and wherein a free end of each of the acute end microstructures is sharp and has an angle of less than or equal to 40 degrees.

7. The sensor package structure according to claim 1, wherein the ring-shaped arrangement of the strips is rectangular, and the strips includes two first strips facing toward each other and two second strips that face toward each other, and wherein the round-ended microstructures are arranged on the adjustment segment and the two layout segments of each of the two first strips.

8. The sensor package structure according to claim 7, wherein the zigzagged microstructures further include a plurality of acute end microstructures arranged on the adjustment segment and the two layout segments of each of the two second strips, and wherein a free end of each of the acute end microstructures is sharp and has an angle of less than or equal to 40 degrees.

9. The sensor package structure according to claim 1, wherein any two of the strips connected to each other jointly define a corner that is provided with one of the round-ended microstructures arranged thereon.

10. The sensor package structure according to claim 1, wherein each of the strips includes an elongated base, and each of the round-ended microstructures has a light-guiding portion that connects the round-ended portion to the elongated base; and wherein, in each of the round-ended microstructures, the light-guiding portion gradually tapers in a direction from the elongated base toward the round-ended portion.

11. The sensor package structure according to claim 1, further comprising:
a plurality of metal wires electrically coupled to the substrate and the sensor chip; and
an encapsulant formed on the substrate, wherein the sensor chip, the ring-shaped supporting layer, and the light-permeable layer are embedded in the encapsulant, and an outer surface of the light-permeable layer arranged away from the substrate is at least partially exposed from the encapsulant.

12. A sensing module of a sensor package structure, comprising:
a sensor chip having a top surface including a sensing region and a carrying region that surrounds the sensing region;
a ring-shaped supporting layer being disposed on the carrying region of the sensor chip and surrounding the sensing region, wherein the ring-shaped supporting layer includes a plurality of strips in a ring-shaped arrangement, wherein any two of the strips connected to each other jointly define one of corners, and wherein the ring-shaped supporting layer includes:
an inner surrounding surface facing toward the sensing region; and
an outer surrounding surface arranged away from the sensing region, wherein at least one of the inner surrounding surface and the outer surrounding surface has a plurality of zigzagged microstructures, wherein the zigzagged microstructures include a plurality of round-ended microstructures having a free end that is a round-ended portion having a radius of less than 1 µm, and wherein each of the corners is provided with one of the round-ended microstructures arranged thereon; and
a light-permeable layer disposed on the ring-shaped supporting layer, wherein the light-permeable layer, the inner surrounding surface of the ring-shaped supporting layer, and the top surface of the sensor chip jointly define an enclosed space.

13. The sensing module according to claim 12, wherein the zigzagged microstructures further include a plurality of acute end microstructures arranged on the strips, and the acute end microstructures of each of the strips are arranged in one row located between the round-ended microstructures arranged on two of the corners.

14. The sensing module according to claim 13, wherein the round-ended microstructure on each of the corners is arranged on the inner surrounding surface.

15. The sensing module according to claim 14, wherein the outer surrounding surface has a plurality of arc angles respectively arranged on the corners; and wherein, in each of the corners, a radius of the arc angle is greater than the radius of the round-ended portion of the round-ended microstructure.

16. A sensing module of a sensor package structure, comprising:
a sensor chip having a top surface including a sensing region and a carrying region that surrounds the sensing region;
a ring-shaped supporting layer being disposed on the carrying region of the sensor chip and surrounding the sensing region, wherein the ring-shaped supporting layer includes:
an inner surrounding surface facing toward the sensing region; and
an outer surrounding surface arranged away from the sensing region, wherein at least one of the inner surrounding surface and the outer surrounding surface has a plurality of round-ended microstructures sequentially connected to surround the sensing region, wherein a free end of the round-ended microstructures is a round-ended portion having a radius of less than 1 µm; and
a light-permeable layer disposed on the ring-shaped supporting layer, wherein the light-permeable layer, the inner surrounding surface of the ring-shaped supporting layer, and the top surface of the sensor chip jointly define an enclosed space.

17. The sensing module according to claim 16, wherein the round-ended microstructures are only arranged on the inner surrounding surface, and two opposite ends of each of the round-ended microstructures are respectively connected to the sensor chip and the light-permeable layer.

18. The sensing module according to claim 16, wherein the round-ended microstructures are only arranged on the outer surrounding surface, and two opposite ends of each of the round-ended microstructures are respectively connected to the sensor chip and the light-permeable layer.

19. The sensing module according to claim 16, wherein the round-ended microstructures are only arranged on the inner surrounding surface and the outer surrounding surface, and two opposite ends of each of the round-ended microstructures are respectively connected to the sensor chip and the light-permeable layer, and wherein a shape of any one of the round-ended microstructures on the inner surrounding surface is different from a shape of any one of the round-ended microstructures on the outer surrounding surface.

20. The sensing module according to claim 16, wherein the ring-shaped supporting layer includes a ring-shaped base, and each of the round-ended microstructures has a light-guiding portion that connects the round-ended portion to the ring-shaped base; and wherein, in each of the round-ended microstructures, the light-guiding portion gradually tapers in a direction from the ring-shaped base toward the round-ended portion.

* * * * *